United States Patent
Elgin, II et al.

(10) Patent No.: US 6,892,440 B2
(45) Date of Patent: May 17, 2005

(54) METHOD FOR WINDING AN EMBEDDED B-ZERO COIL

(75) Inventors: Stephen R. Elgin, II, Florence, SC (US); Michael R. Eggleston, Florence, SC (US); Minfeng Xu, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 562 days.

(21) Appl. No.: 09/963,982

(22) Filed: Sep. 26, 2001

(65) Prior Publication Data

US 2003/0060701 A1 Mar. 27, 2003

(51) Int. Cl.⁷ ............................................. H01L 39/24
(52) U.S. Cl. ...................... 29/599; 335/216; 505/100; 505/430; 505/431; 505/432
(58) Field of Search .................... 29/599, 447; 335/216; 505/100, 430, 431, 432

(56) References Cited

U.S. PATENT DOCUMENTS

| | | | |
|---|---|---|---|
| 3,801,029 A | * | 4/1974 | Malburg |
| 5,187,859 A | * | 2/1993 | Helm |
| 5,531,015 A | * | 7/1996 | Manlief et al. |
| 5,604,473 A | * | 2/1997 | Rodenbush |
| 5,649,353 A | * | 7/1997 | Salasoo et al. |
| 5,798,678 A | * | 8/1998 | Manlief et al. |
| 6,002,316 A | * | 12/1999 | McIntyre et al. |

* cited by examiner

Primary Examiner—Carl J. Arbes
(74) Attorney, Agent, or Firm—Joseph S. Heino; Carl B. Horton

(57) ABSTRACT

A method for winding on embedded b-zero coil maintains the integrity of superconducting main coil and the b-zero wire during coil winding and during normal operation of a superconducting MRI magnet. The b-zero coil is co-wound with an aluminum overwrap while the aluminum overwrap is being wound onto the superconducting MRI coil. The two-wire geometries are selected such that the height or thickness of the aluminum overwrap is greater than or equal to the height or thickness of the b-zero coil wire. The b-zero coil wire sits in a cavity that is created by adjacent turns.

9 Claims, 1 Drawing Sheet

METHOD FOR WINDING AN EMBEDDED B-ZERO COIL

BACKGROUND OF THE INVENTION

This invention relates to a method and apparatus for manufacturing superconducting magnet coils for use in magnetic resonance imaging and, more particularly, to a method for overwrapping an embedded b-zero coil about the superconducting magnet coil.

When a substance such as human tissue is subjected to a uniform magnetic field (polarizing field b-zero, $b_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. An NMR signal is emitted by the excited spins after the excitation signal $B_1$ is terminated and, this signal may be received and processed to form an image.

As is well know, a magnet can be made superconducting by placing superconducting magnet coils in an extremely cold environment, such as by enclosing it in a cryostat, or pressure vessel, containing liquid helium or other cryogen. The extreme cold reduces the resistance in the magnet coils to negligible levels, such that when a power source is initially connected to the coil (for a period, for example, of ten minutes) to introduce a current flow through the coils, the current will continue through the coils due to the negligible resistance, even after power is removed, thereby maintaining a magnetic field. Superconducting magnets find wide application, for example, in the field of medical magnetic resonance imaging (hereinafter called "MRI").

As is also well known, MRI requires very strong or large magnetic fields in the imaging bore. Such fields require a very high degree of uniformity or homogeneity. Such fields are, however, also subject to the effects of external disturbances. The superconducting magnetic field is generated by current flow through superconducting magnet coils, each having as many as 10,000 turns. The many turns and layers of turns must be insulated from each other and the insulation integrity must be maintained during superconducting operation, including the ramping up of the coils to the operating current, and the possible sudden quenching, or discontinuance, of superconducting operation. Any shorting of magnet coil turns can produce heat which can lead to very serious inadvertent quenching of magnet operation which leads to the sudden escape of helium and the need to replenish the liquid helium and again ramp the MRI magnet up to operating current entailing significant equipment down time and expense. Such shorting can also damage the superconducting wire, rendering the MRI magnet inoperable. Because of the extreme high current levels involved in the high strength magnetic fields, the superconducting magnet coils must undergo extreme and difficult operating environment and forces, including significant thermal, magnetic, electrical and mechanical forces generated during such operations. As a result, the cost of producing superconducting magnetic coils and magnets is relatively high, frequently costing into the hundreds of thousands of dollars for a single MRI magnet assembly.

The homogeneity requirement for the magnetic field of the MRI cannot be achieved simply by controlling manufacturing tolerances. In practice, extra coils, typically called correction coils and/or passive shims, are provided to correct or improve the magnetic homogeneity. This allows for reasonable manufacturing tolerances. Additionally, b-zero coils are used on superconducting MRI magnets to minimize the effect of external disturbances. The effectiveness of the superconducting b-zero coil is dependent on the location in relation to the main field windings of the coil. In methods of current production, b-zero coils are wound on a flat surface and a fiberglass structure is formed over the coils. This method limits the ability of a designer to optimize the location of the b-zero coils. Accordingly, the limitations on the b-zero coil location limit the ability of the b-zero coil to effectively reduce external disturbances to the magnetic field.

Furthermore, considerable engineering and development has been applied for some time to improving and simplifying, to the extent possible, the magnetic systems for MRI devices so as to minimize the effects of external disturbances in order to improve imaging quality with uncomplex means and without additional expense. In the method of current magnet design, such analysis shows that one of the most effective locations for the b-zero coil is directly on top of the bucking coil superconducting wire. Unfortunately, a layer of aluminum overwrap is required on this surface to provide structural integrity to the superconducting coil. Placing the thin b-zero wire, which is typically manufactured as a thin copper wire having a Formvar® or similar insultation, between the main superconducting coil and the aluminum overwrap would most likely result in damage to the wire due to the highly compressive forces that develop during coil winding, cool down and magnet operation as previously described.

What is needed is a method for winding an embedded b-zero coil about a main coil that maintains the integrity of the superconducting coil and the b-zero wire during coil winding and also during normal operation of the superconducting MRI magnet. What is also needed is such a method that is not location sensitive but that allows for placement of the b-zero wire wherever such is desired or required by the designer, and at a cost savings to overall production.

BRIEF SUMMARY OF THE INVENTION

In accordance with one form of the invention, a superconducting magnet coil for use in magnetic resonance imaging is overlaid with a b-zero coil. The b-zero coil is co-wound with the aluminum overwrap while the aluminum overwrap is being wound onto the superconducting MRI coil. The existing product process is modified such that two-wires, the aluminum wire and the b-zero superconducting wire, are wound side-by-side on top of the superconducing MRI coil. The two-wire geometries are selected such that the height or thickness of the aluminum overwrap is greater than or equal to the height of the b-zero coil wire. In this fashion, the compressive loads from subsequent overwrap layers are supported by the aluminum wire only. The b-zero coil wire sits in the cavity that is created between adjacent turns.

DETAILED DESCRIPTION OF THE INVENTION

Figure 1:
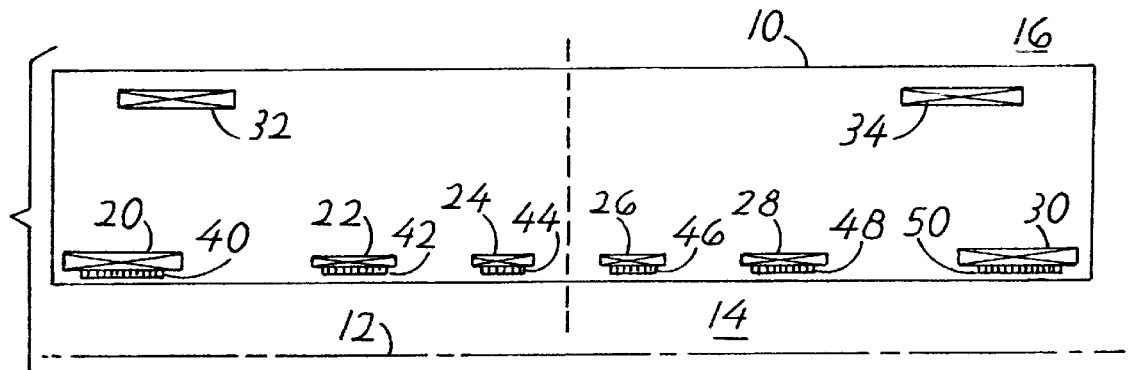
FIG. 1 is a simplified cross-sectional view showing a superconducting magnet assembly of prior construction.

Referring to the drawings in detail wherein like numbered numerals refer to like elements throughout, FIG. 1 illustrates a cryogen or helium pressure vessel 10 that extends along and around axis 12 of imaging bore 14 formed within the helium vessel of superconducting magnet 16. A plurality of main magnet coils 20, 22, 24, 26, 28 and 30 are positioned within helium vessel 10 contiguous to and surrounding imaging bore 14, and axially spaced along axis 12. As is common in magnetic resonance imaging, the axial length of main magnet coils 20, 22, 24, and of 26, 28, and 30, respectively, are different. One or more shielding coils such as those shown by 32 and 34 are included within helium vessel 10 to reduce the magnetic stray field and minimize siting and installation costs.

As shown in FIG. 1, b-zero coils 40, 42, 44, 46, 48 and 50 are each associated with a main magnet coil 20, 22, 24, 26, 28 and 30, respectively. B-zero coils 40, 42, 44, 46, 48 and 50 are used on superconducting magnets 16 to minimize the effect of, and to provide optimum protection from, external disturbances. The effectiveness of the superconducting b-zero coil 40, 42, 44, 46, 48 and 50 is dependent on location. B-zero coils 40, 42, 44, 46, 48 and 50 are currently positioned under the superconducting coils 20, 22, 24, 26, 28 and 30. In current product, the b-zero coils 40, 42, 44, 46, 48 and 50 are wound on a flat surface and a fiberglass structure (not shown) is formed over the coils 40, 42, 44, 46, 48 and 50. In this location, the b-zero coils 40, 42, 44, 46, 48 and 50 are structurally protected by a layer of fiberglass material. This method, however, limits the ability of the designer to optimize the location of the b-zero coils 40, 42, 44, 46, 48 and 50. This limitation on the b-zero coil 40, 42, 44, 46, 48 and 50 location thereby limits the ability of the coils to effectively reduce external disturbances to the magnetic field.

Figure 2:
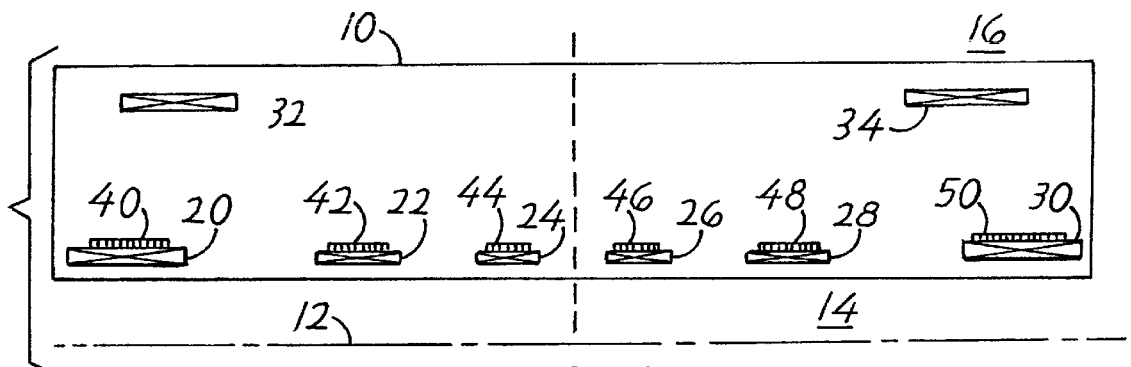
FIG. 2 is a simplified cross-sectional view showing a superconducting magnet assembly in accordance with the invention.

It has been found that one of the most effective locations for the b-zero coil 40, 42, 44, 46, 48 and 50 is directly on top of the main coil 20, 22, 24, 26, 28 and 30. See FIG. 2. In this configuration, however, a layer of aluminum overwrap (not shown) is required to provide structural integrity to the main coil 20, 22, 24, 26, 28 and 30. Placement of the thin copper b-zero wire, the 50 turns or so per layer of which makes up the b-zero coil 40, 42, 44, 46, 48 and 50, between the main superconducting coil 20, 22, 24, 26, 28 and 30 and the aluminum overwrap would likely result in damage to the b-zero wire. The primary reason for this is that, because aluminum "shrinks" more than copper, the aluminum overwrap would exert highly compressive forces on the thin copper b-zero wire during normal magnet 16 operation, including magnet cool-down. The method of the present invention allows the superconducting b-zero coils 40, 42, 44, 46, 48 and 50 to be safely placed directly on top of the main superconducting coils 20, 22, 24, 26, 28 and 30 without the risk of damage to the b-zero coils 40, 42, 44, 46, 48 and 50 from compressive loads created by the aluminum overwrap. Furthermore, b-zero coils 40, 42, 44, 46, 48 and 50 that are positioned directly on top of the main superconducting coils 20, 22, 24, 26, 28 and 30 can, for some magnet geometries, provide improved protection against external field disturbances.

Figure 3:
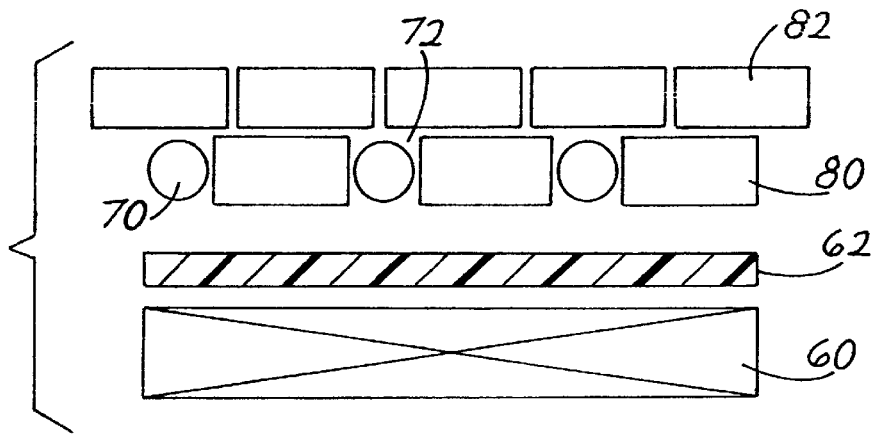
FIG. 3 is an enlarged cross-sectional view showing details of the windings of the embedded b-zero coil in accordance with the invention.

Referring now to FIG. 3, it can be seen that the thin copper wire 70 of any one of the b-zero coils 40, 42, 44, 46, 48 and 50 is co-wound with the wire 80 of the aluminum overwrap 82 while it is being wound on to the superconduting coil 20, 22, 24, 26, 28 and 30. Separating the main coil wires 60 of any one of the main superconducting coils 20, 22, 24, 26, 28 and 30 is an insulator 62. In one embodiment, the insulation is composed of phenolic G-10 or similar insulator. The aluminum wire 80 and the b-zero coil wire 70 are wound side-by-side on top of the insulator 62. In one embodiment, the two wire geometries are selected such that the height or thickness of the aluminum wire 80 is greater than or equal to the height or thickness of the b-zero wire 70. For example, one embodiment selects a rectangular wire geometry for the aluminum wire 80 whereby the aluminum wire 80 has a cross sectioned area measuring 100 mils by 50 mils. That same embodiment selects a circular wire geometry for the b-zero wire 70 of 0.040 in. or 40 mils across. Overlaying this layer of aluminum and b-zero wires 80, 70, respectively, is the aluminum overwrap 82. The overwrap 82 may, but not need to, be of the same wire geometry of the underlying aluminum wire 80. In this fashion, the compressive loads from subsequent overwrap layers are supported by the aluminum wire 80 only. The b-zero wire 70 sits in the cavity 72 that is created between adjacent turns.

While the present invention has been described with respect to certain preferred embodiments thereof, it is to be understood that numerous variations in the details of construction, the arrangement an combination of parts, and the type of materials used may be made without departing from the spirit and scope of the invention.

Parts List:
10 pressure vessel
12 axis of imaging bore
14 imaging bore
16 superconducting magnet
20 main coil
22 main coil
24 main coil
26 main coil
28 main coil
30 main coil
32 shielding coil
34 shielding coil
40 b-zero coil
42 b-zero coil
44 b-zero coil
46 b-zero coil
48 b-zero coil
50 b-zero coil
60 main coil
62 insulator
70 b-zero wire
72 cavity
80 aluminum wire
82 aluminum overwrap

What is claimed is:

1. A method of forming a b-zero coil (40, 42, 44, 46, 48 and 50) about a superconducting main (20, 22, 24 26, 28 and 30) coil for use in magnetic resonance imaging comprising the steps of providing a superconducting magnet coil (60);

overlaying the superconducting magnet coil (60) with a layer of insulation material (62);

winding a b-zero coil wire (70) into at least one layer about said insulation layer (62) to form a b-zero superconducing coil (40, 42, 44, 46, 48 and 50);

co-winding with said b-zero coil wire (70) a second wire (80);

wherein adjacent windings of such second wire (80) form a cavity (72) therebetween; and wherein adjacent windings of b-zero coil wire (70) lie within such cavity (72).

2. The method of forming a b-zero coil (40, 42, 44, 46, 48 and 50) of claim 1 including the additional steps of overlaying the layer of b-zero coil wire (70) with at least one layer of second wire (82).

3. The method of forming a b-zero coil (40, 42, 44, 46, 48 and 50) of claim 2 wherein said b-zero wire (70) is made of superconducting wire.

4. The method of forming a b-zero coil (40, 42, 44, 46, 48 and 50) of claim 3 wherein said second wire (80) is made of aluminum.

5. A method of forming an embedded b-zero coil (40, 42, 44, 46, 48 and 50) about a superconducting main coil (20, 22, 24 26, 28 and 30) for use in magnetic resonance imaging comprising the steps of providing a superconducting magnet coil (60);

overlaying the superconducting magnet coil (60) with a layer of insulation material (62);

winding a b-zero coil wire (70) into at least one layer about said insulation layer (62) to form a b-zero superconducting coil (40, 42, 44, 46, 48 and 50);

co-winding a second wire with said b-zero coil wire (70);

wherein adjacent windings of such second wire (80) form a cavity (72) therebetween; and wherein adjacent windings of b-zero coil wire (70) lie within such cavity (72).

6. The method of forming an embedded b-zero coil (40, 42, 44, 46, 48 and 50) of claim 5 wherein said winding and co-winding is controlled to provide spaces between adjacent windings.

7. The method of forming an embedded b-zero coil (40, 42, 44, 46, 48 and 50) of claim 6 including the additional step of overlaying the layer of b-zero coil wire (70) with at least one layer of second wire (80).

8. The method of forming an embedded b-zero coil (40, 42, 44, 46, 48 and 50) of claim 7 wherein said b-zero wire (70) is made of superconducting wire.

9. The method of forming an embedded b-zero coil (40, 42, 44, 46, 48 and 50) of claim 8 wherein said second wire (80) is made of aluminum.

* * * * *

UNITED STATES PATENT AND TRADEMARK OFFICE
CERTIFICATE OF CORRECTION

PATENT NO. : 6,892,440 B2
DATED : May 17, 2005
INVENTOR(S) : Elgin, II et al.

It is certified that error appears in the above-identified patent and that said Letters Patent is hereby corrected as shown below:

Column 5,
Line 5, replace the word "steps" with the word -- step --.

Signed and Sealed this

Eighteenth Day of October, 2005

JON W. DUDAS
*Director of the United States Patent and Trademark Office*